United States Patent

Roy et al.

[11] Patent Number: 5,996,594
[45] Date of Patent: Dec. 7, 1999

[54] POST-CHEMICAL MECHANICAL PLANARIZATION CLEAN-UP PROCESS USING POST-POLISH SCRUBBING

[75] Inventors: Sudipto Ranendra Roy; Iqbal Ali, both of Plano; Gregory B. Shinn, Dallas; Rajani C. Shah; Shelley H. Peterman, both of Austin, all of Tex.; Srini Raghavan, Tucson, Ariz.

[73] Assignees: Texas Instruments Incorporated, Dallas, Tex.; International Business Machines, Armonk, N.Y.

[21] Appl. No.: 08/666,189

[22] Filed: Mar. 19, 1996

Related U.S. Application Data

[62] Division of application No. 08/598,862, Feb. 9, 1996, abandoned, which is a continuation of application No. 08/346,720, Nov. 30, 1994, abandoned.

[51] Int. Cl.$^6$ ............................. B08B 1/02; B08B 3/12; C03C 15/00; C23G 1/02
[52] U.S. Cl. ............................. 134/1.3; 134/2; 134/3; 134/6; 134/7; 134/1; 134/26; 134/32; 134/33; 134/902; 156/636
[58] Field of Search ....................... 134/1.3, 1, 2, 3, 134/6, 7, 26, 32, 33, 902; 156/636

[56] References Cited

U.S. PATENT DOCUMENTS

| | | | |
|---|---|---|---|
| 5,375,291 | 12/1994 | Tateyama et al. | 15/302 |
| 5,518,552 | 5/1996 | Tanoue et al. | 134/1 |
| 5,597,443 | 1/1997 | Hempel | 156/636.1 |

OTHER PUBLICATIONS

Sivaram, Srinivasan, "Planarizing Interlevel Dielectrics by Chemical–Mechanical Polishing", Solid State Technology, May 1992, pp. 87–91.

Iqbal Ali, Sudipto R. Roy and Gregory B. Shinn, Texas Instruments; Srini Raghavan, University of Arizona; and Raj Shah and Shelley Peterman, Semateck; "Investigating the Effect of Secondary Platen Pressure on Post–Chemical-Mechanical Planarization Cleaning"; Microcontamination Journal, Oct. 1994, pp. 45–50.

*Primary Examiner*—Zeinab El-Arini
*Attorney, Agent, or Firm*—Jacqueline J. Garner; W. James Brady, III; Richard L. Donaldson

[57] ABSTRACT

A post chemical-mechanical polishing clean-up process. Particles and ionic and metallic contaminants remaining on wafer 32 surface after CMP are removed and scratches are smoothed. The wafer 32 may be subjected to a high pressure/high rotational speed rinse at spindle rinse station 42 followed by buffing of the wafer 32 on a second polishing platen 38. If desired, a second high pressure/high speed rinse at spindle rinse station 42 may be performed after the buffing step. The wafer 32 may then be then transferred to a tank 50 for a megasonic bath and after the megasonic bath, the wafer 32 is transferred to a scrubber 44, which scrubs both surfaces of the wafer 32 with brushes and then spins the wafer 32 dry as spin station 84. All transfers are performed in a solution such as DI water to prevent drying of slurry on the wafer surface.

29 Claims, 9 Drawing Sheets

POST-CHEMICAL MECHANICAL PLANARIZATION CLEAN-UP PROCESS USING POST-POLISH SCRUBBING

This is a Division, of application Ser. No. 08/598,862, filed Feb. 9, 1996, now abandoned; which is a Continuation of Ser. No. 08/346,720, filed Nov. 30, 1994, now abandoned.

CROSS REFERENCE TO RELATED APPLICATIONS

The following co-assigned patent applications are hereby incorporated by reference:

| Serial No. | Filing Date | Inventor |
| --- | --- | --- |
| 08/346,970 | 11/30/94 | Roy et al. |
| 08/347,545 | 11/30/94 | Roy et al. |
| 08/346,704 | 11/30/94 | Roy et al. |

1. Field of the Invention

This invention generally relates to semiconductor processing and more specifically to post chemical mechanical polishing clean-up processes.

2. Background of the Invention

As circuit dimensions shrink the need for fine-line lithography becomes more critical and the requirements for planaizing topography becomes very severe. Major U.S. semiconductor companies are actively pursuing Chemical-Mechanical Polishing (CMP) as the planarization technique used in the sub-half micron generation of chips. CMP is used for planarizing bare silicon wafers, interlevel dielectrics, and other materials. CMP machines, such as the one shown in FIG. 1, use orbital, circular, lapping motions. The wafer 16 is held on a rotating carrier 18 while the face of the wafer 16 being polished is pressed against a resilient polishing pad 14 attached to a rotating spindle 12. A. slurry 20 is used to chemically attack the wafer surface to make the surface more easily removed by mechanical abrasion.

One of the major problems facing CMP is the removal of particles from the wafer surface remaining after polishing is completed. The primary sources of particles are the slurry and the polishing pad. Prior art post-CMP cleanup methods use a standard megasonic cleanup using a very high concentration of $NH_4OH$ followed by spin rinse drying. However, agglomeration of silica particles from the slurry remains of particular concern because as the agglomeration of silica particles dries, it bonds to the surface of the wafer and becomes practically impossible to remove. Accordingly, there is a need for a post-CMP cleanup process that better addresses the issue of agglomeration of slurry particles on the wafer.

SUMMARY OF THE INVENTION

A post chemical-mechanical polishing clean-up process is described herein. Particles and ionic and metallic contaminants remaining on the wafer surface after CMP are removed and scratches are smoothed. In one embodiment, the wafer is subjected to a high pressure/high rotational speed spindle rinse followed by buffing of the wafer on a second polishing platen. If desired, a second high pressure/high speed spindle rinse may be performed after the buffing step. In this embodiment, the wafer is then transferred to a megasonic bath and after the megasonic bath, the wafer may be transferred to a scrubber, which scrubs both surfaces of the wafer with brushes and then spins the wafer dry. All transfers as performed in a solution such as DI water to prevent drying of slurry on the wafer surface.

An advantage of the invention is providing an improved post-CMP clean-up process.

A further advantage of the invention is providing an improved post-CMP clean-up process that significantly reduces particle levels.

A further advantage of the invention is providing an improved post-CMP clean-up process that reduces surface roughness and scratches on the wafer.

A further advantage of the invention is providing an improved post-CMP clean-up process that removes ionic and metallic contaminants on the wafer surface.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a CMP cleanup process for interlevel dielectric films. It will be apparent to those skilled in the art that the invention is also applicable to CMP of other films such as metal films including tungsten, aluminum, and copper damascene.

Figure 1:
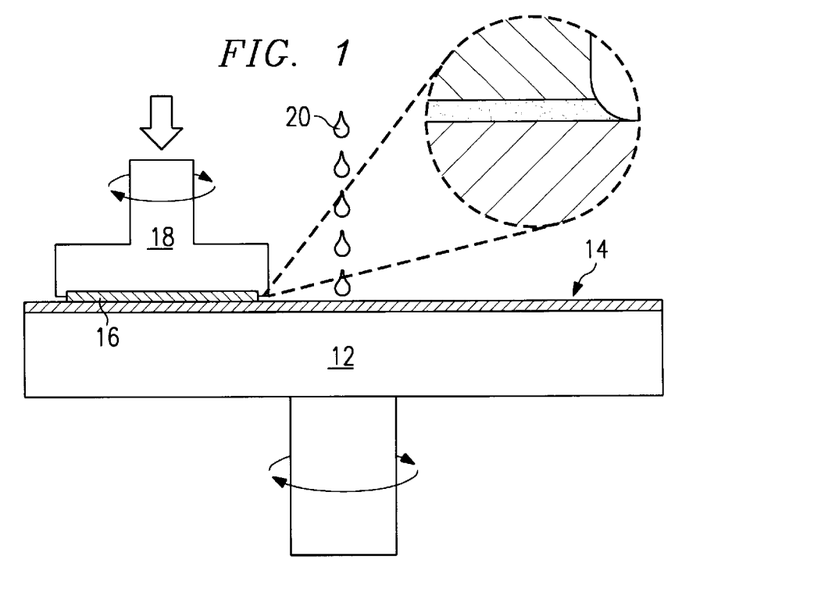
FIG. 1 is a block diagram of a prior art CMP system.

CMP machines, such as the one shown in FIG. 1, use orbital, circular, lapping motions. The wafer 16 is held on a rotating carrier 18 while the face of the wafer 16 being polished is pressed against a resilient polishing pad 14 attached to a rotating spindle 12. A slurry 20 is used to chemically attack the wafer surface to make the surface more easily removed by mechanical abrasion.

Figure 2:
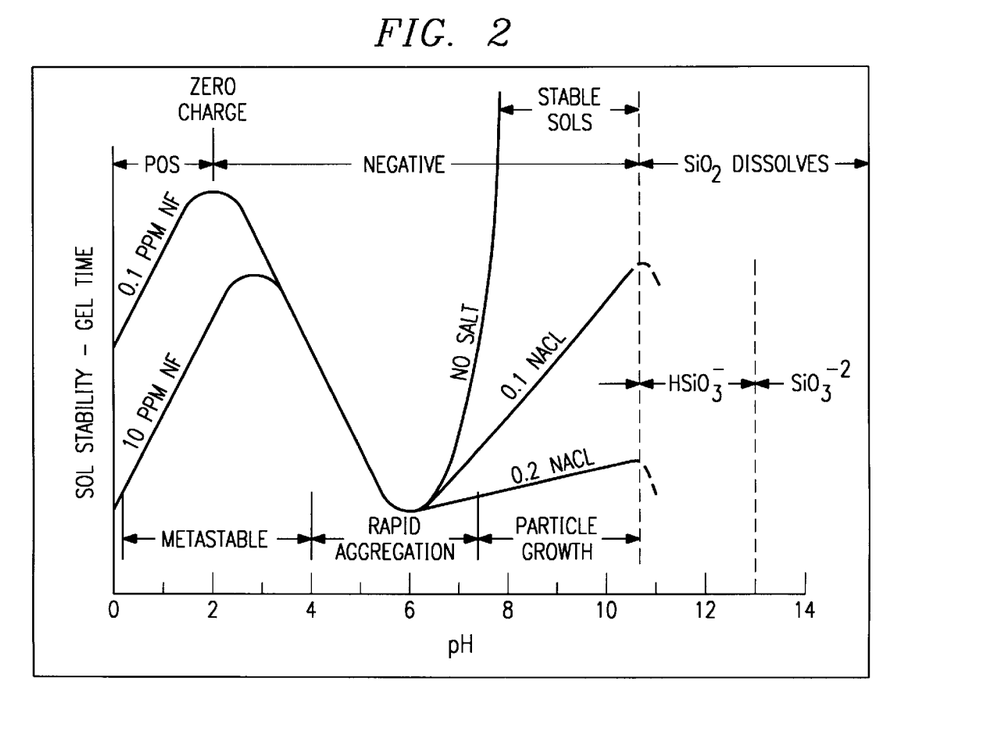
FIG. 2 is a graph illustrating the gelling effects of slurry.

The potassium-hydroxide (KOH) based colloidal fumed silica slurry that is used in CMP is a major source of particles. Agglomeration (gelling) of silica particles after polishing is a known source of particles. FIG. 2 shows the gelling characteristics of silica. At a pH of about 6.0, severe gelation of silica particles takes place, whereas it is quite stable around a pH of 10.5. The slurry typically used during CMP has a pH around 10.5 which does not pose any problem. But, the subsequent post-polish rinse using DI water (which has a pH of around 6.0) reduces the pH of the solution significantly. As a result, silica gelation may take place due to the pH shock.

Figure 3:
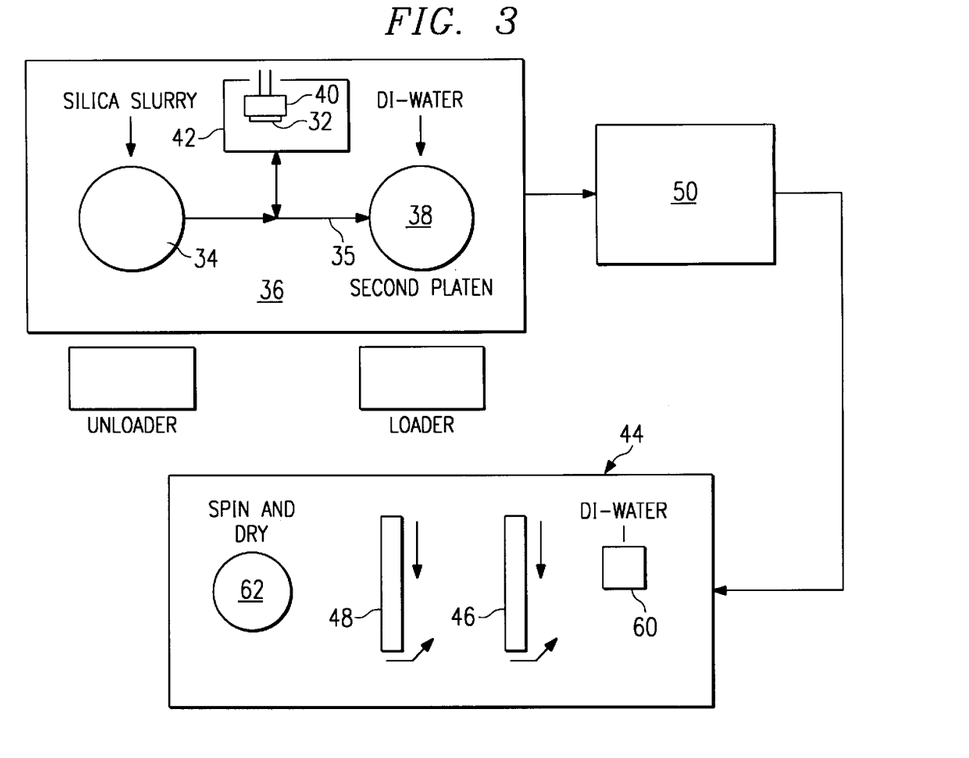
FIG. 3 is a block: diagram of a CMP plus post-CMP clean process according to the invention.

FIG. 3 illustrates a flow diagram of a post-CMP clean-up process according to the invention. After a wafer 32 is chemically-mechanically polished on a first platen 34 in a polisher 36, the wafer 32 may be transferred by spindle 40 to a spindle rinse station 42. Spindle 40 is sometimes referred to as a wafer carrier and is the same spindle that holds wafer 32 during CMP polishing.

At the spindle rinse station 42, a rinsing solution is applied to the wafer 32 and spindle 40 under high pressure while the spindle 40 rotates at a high speed on the order of 120 rpm. The rinsing solution may comprise DI water or DI water with a basic solution or surfactant. The pressure from the rinsing solution as well as the centrifugal force caused by rotation cause the removal of particles and ionic and metallic contaminants from the wafer 32 surface by shearing action. Depending on the spindle rinse spray nozzle design, DI water pressure may vary from 30 psi to 90 psi and the duration of spindle rinse can be as low as 30 seconds.

Figure 4:
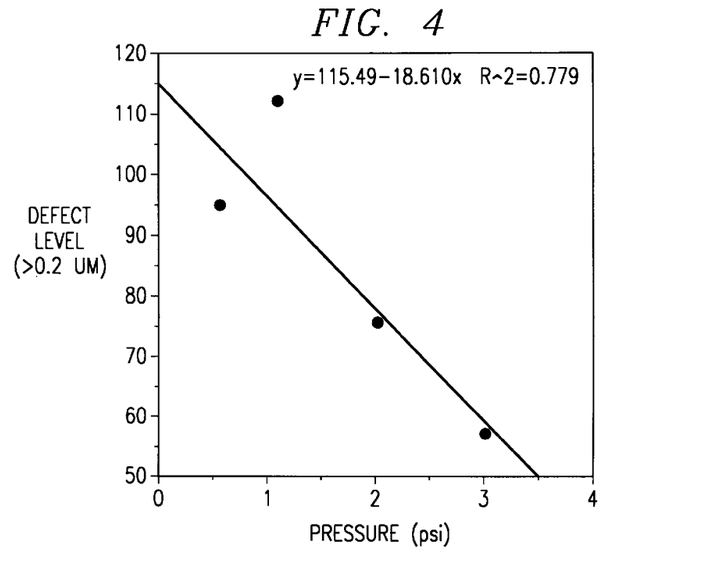
FIG. 4 is a graph of polish pressure versus defect level.

After the high pressure/high speed spindle rinse, the wafer 32 is transferred by spindle 40 to a second platen 38. The second platen 38 is used for buffing. Buffing may be accomplished using a high nap polytex pad on second platen 38. A buffing pressure (down force between the pad and the wafer) on the order of 0.5–5 psi may be used. The spindle 40 is again rotated at a speed on the order of 30–150 rpms. The second platen 38 is rotated at a speed on the order of 30–50 rpms. The duration of the buffing process is on the order of 2–3 minutes. Buffing removes particles, ionic and metallic contaminants, and reduces surface scratches and roughness. The addition of DI water during the buffing process is beneficial in preventing the remaining slurry particles from drying onto the wafer surface. The effect of polish pressure on defect level is shown in FIG. 4. An increase in buffing pressure decreases the defect level when DI water is added to the process. However, this is balanced against the fact that the increased pressure reduces the life of the polishing pad. The preferred embodiment uses a buffing pressure of 3 psi, a high speed/high pressure spindle rinse, DI water with a pH of approximately 6.0, a spindle rpm of 120, and a carrier rpm of 30. Buffing can also be done in presence of a basic solution and/or surfactant but at reduced buffing pressure. For polishers that do not have a second platen, buffing can be accomplished by having a similar arrangement in principle in the polisher or outside.

Figure 5:
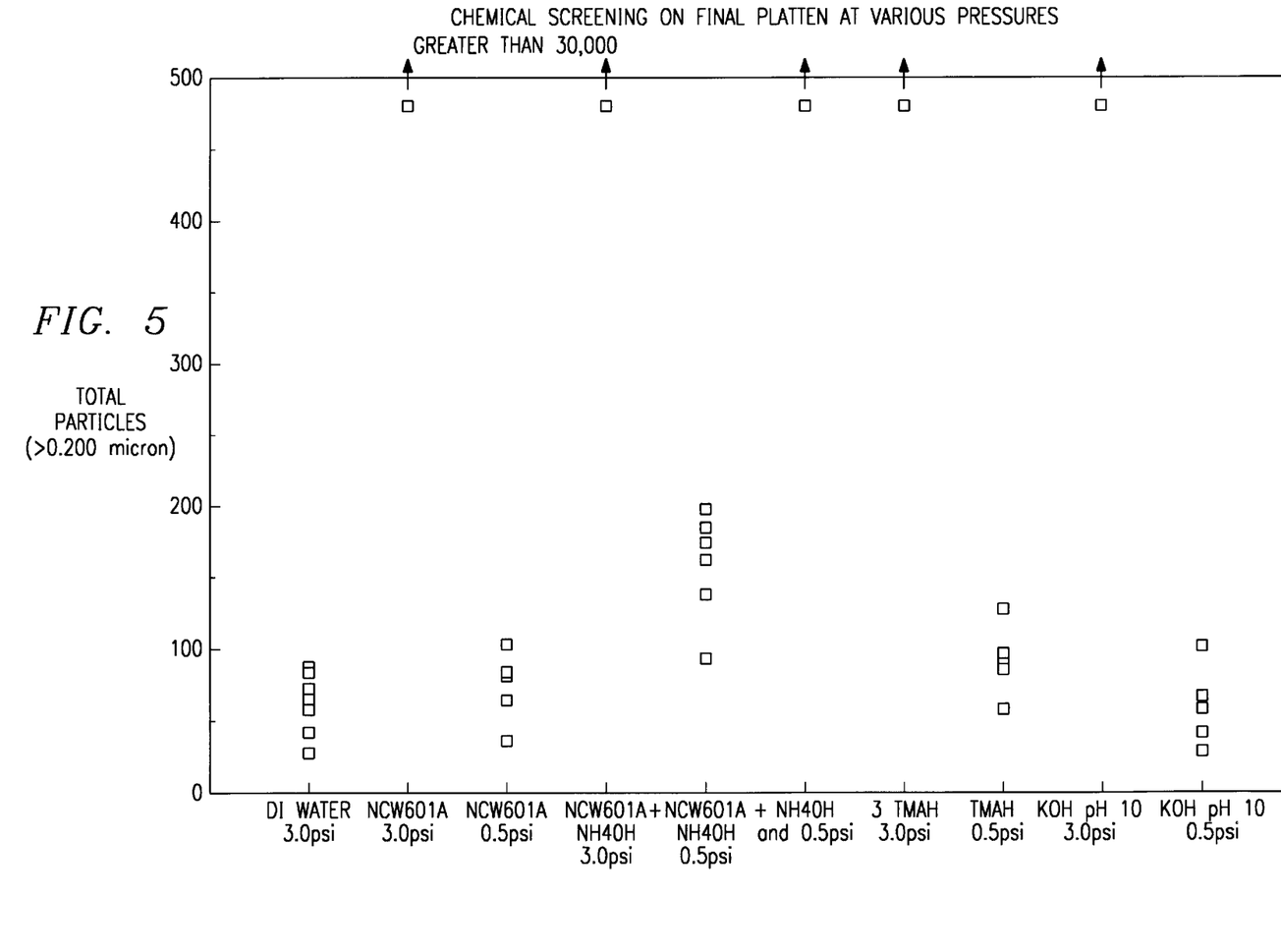
FIG. 5 is a graph of chemistry and buff pressure versus particle count.
Figure 6A:
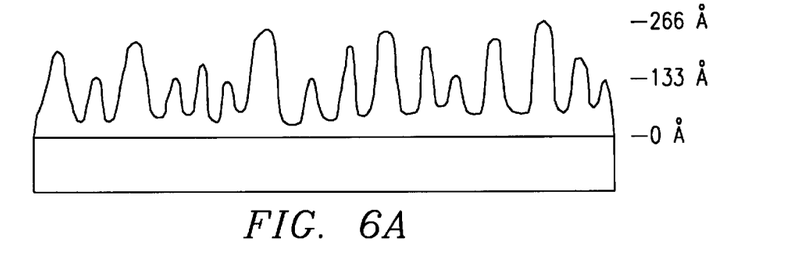
FIGS. 6a–d are three dimensional images of a wafer surface after buffing according to the invention.
Figure 6B:
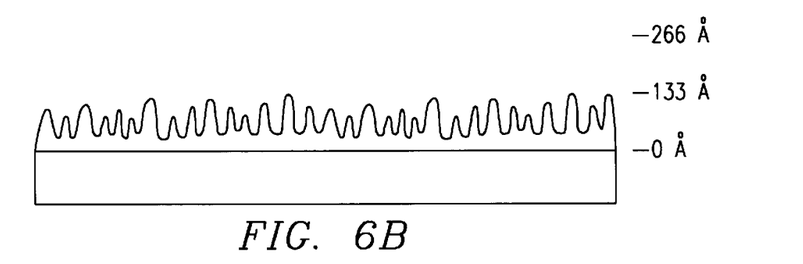
Figure 6C:
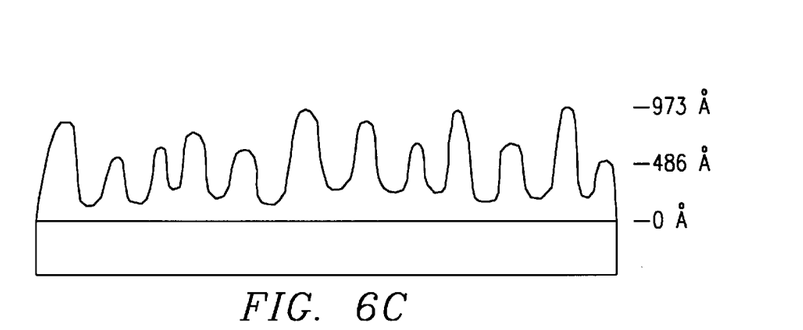
Figure 6D:
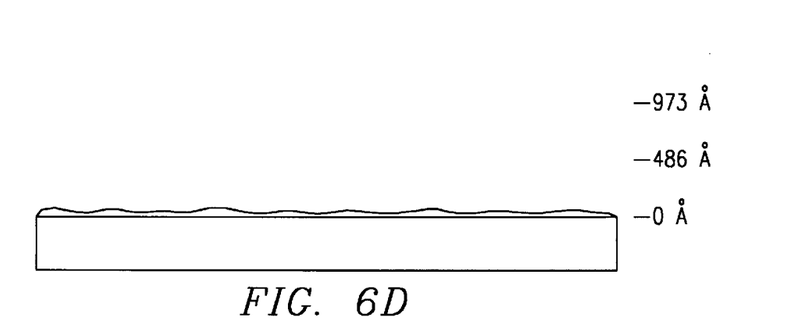

It should be noted that other chemistries may be used in place of DI water, such as ammonium hydroxide ($NH_4OH$), tetramethyl ammonium hydroxide (TMAH), non-ionic surfactant, anionic surfactant, cationic surfactant, or KOH, etc. FIG. 5 shows experimental results of various chemistries and buffing pressures versus particle count. When DI water was used, a higher spindle pressure in second platen resulted in a lower particle count. At a pressure of 3 psi, particle count was about 30–40 on a 150 mm wafer. When a non-ionic surfactant (10 cc of NCW 601 A in 5 gallons of water) was used at 3 psi, a larger scatter in the data was observed. However, when 0.5 psi was used, the particle level was much lower. The same is true for the non-ionic surfactant with $NH_4OH$, TMAH and KOH.

FIGS. 6a–d are three dimensional images of wafer surfaces for buffing chemistries of DI water at 0.5 psi, DI water at 3 psi, KOH at 0.5 psi and KOH at 3 psi, respectively. The wafers buffed with DI water at 0.5 psi are slightly rougher than those buffed with DI water at 3 psi. However, the effect is more pronounced with the KOH solution. Wafers buffed with KOH at 0.5 psi are much smoother than wafer buffed with KOH at 3 psi.

After the buffing process, wafer 32 may be transferred once again to the spindle rinse station 42. A rinsing solution is again applied under high pressure and high spindle rotational speed. The rinsing solution may comprise DI water or DI water with basic chemistry or surfactant. A speed on the order of 120 rpms is preferred. The rinsing solution may be supplied at a pressure on the order of 30–90 psi for as little as 30 seconds.

It should be noted that the buffing and high pressure/high speed spindle rinse may be used in combination or individually. If desired, only one spindle rinse may be performed. In addition, the buffing and spindle rinse may be combined with the processes described below or omitted in favor of the processes described below.

Once the wafer 32 has been buffed and/or spindle rinsed as desired, it may preferably be transferred to a megasonic bath tank 50, using a wet transfer. Wafer 32 is preferably kept wet during the transfer via, for example, de-ionized (DI) water 35 or DI water with chemistries including surfactant and basic chemistries to reduce slurry particle drying and agglomeration on the wafer 32 surface. Those skilled in the art will recognize that other fluids may be used in place of DI water such as anionic, non-ionic, or cationic solutions. It is very important that the slurry is not allowed to dry on the wafer surface. Dried slurry is practically impossible to clean unless the wafer surface is pre-conditioned immediately after the polish step with chemicals and/or surfactant. This is due to the fact that a chemical bond of the silica particle to the wafer surface occurs when the slurry dehydrates. For this reason, the wafer surface is preferably kept wet through-out the clean-up process to prevent the slurry remaining on the wafer surface from drying.

A megasonic bath having an appropriate pH further removes particles and metallic and ionic contaminants. A megasonic cleaning bath is accomplished by filling the megasonic bath tank 50 with a cleaning solution, such as $NH_4OH$, and applying megasonic power on the order of 250 watts. After the desired amount of time, the tank 50 is emptied. Quick rinsing cycles may be added before and after the megasonic cleaning bath to improve results. A megasonic rinsing bath may also be included. A megasonic rinsing bath comprises filling the tank 50 with a rinsing solution such as DI water and applying megasonic power on the order of 250 watts. Again, after a certain amount of time, the tank 50 is emptied.

One preferable sequence for the megasonic bath is a quick-dump rinse, 5 minutes in a megasonic cleaning bath in a selected chemistry such as $NH_4OH$, two quick-dump-rinses, a five minute DI water megasonic rinsing bath and two more quick-dump rinses. A quick dump rinse is quick draining of the liquid out of the tank after the tank has been filled. The megasonic power is preferably on the order of 250 watts for both the megasonic cleaning and rinsing baths. Possible selected chemistries to be used in place of the $NH_4OH$ include KOH with a pH of 10–10.5, TMAH with a pH of 9–9.5, $NH_4OH:H_2O:DI$ water at a ratio of 1:1:6, TMAH solutions with surfactant, non-ionic surfactant, and cationic surfactant. It is important that the selected chemistry have a pH similar to that of the slurry used in the CMP polish. This will inhibit pH shock and thus slurry agglomeration. Other megasonic bath sequences will be apparent to those skilled in the art. Selecting a similar pH chemistry also allows tremendous savings in chemical usage since it effectively uses very little chemical usually.

Figure 7:
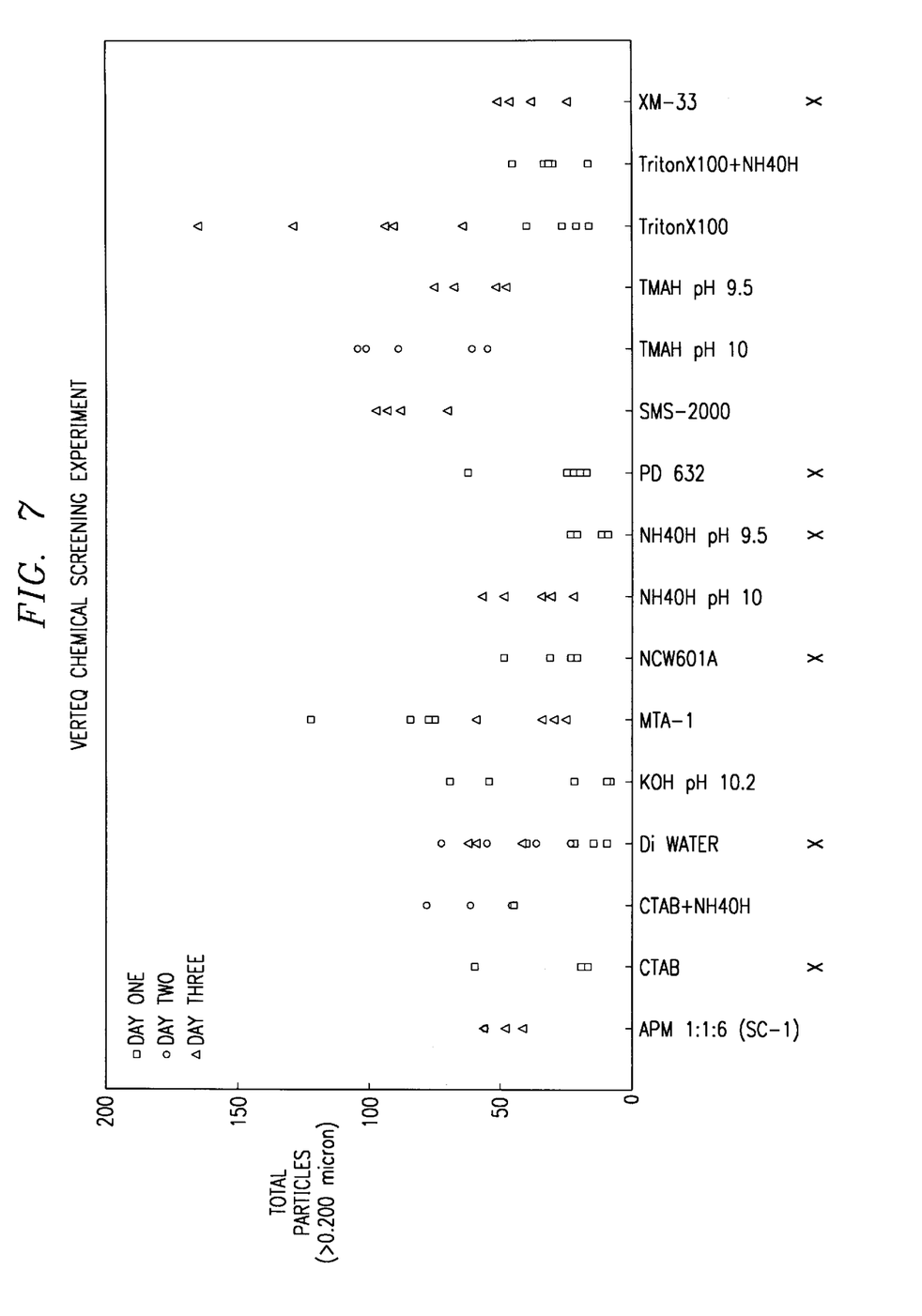
FIG. 7 is a graph of particle count versus chemical type.

Particles remaining after a megasonic bath using the above listed chemicals are shown in FIG. 7. Process conditions used to obtain this data included an immersion in DI water, a quick dump rinse, 10 minute megasonic bath in the selected chemical, two quick dump rinse cycles, a five minute DI water megasonic bath and two additional quick dump rinse cycles. The results are not significantly different for most of the chemicals tested.

Figure 8:
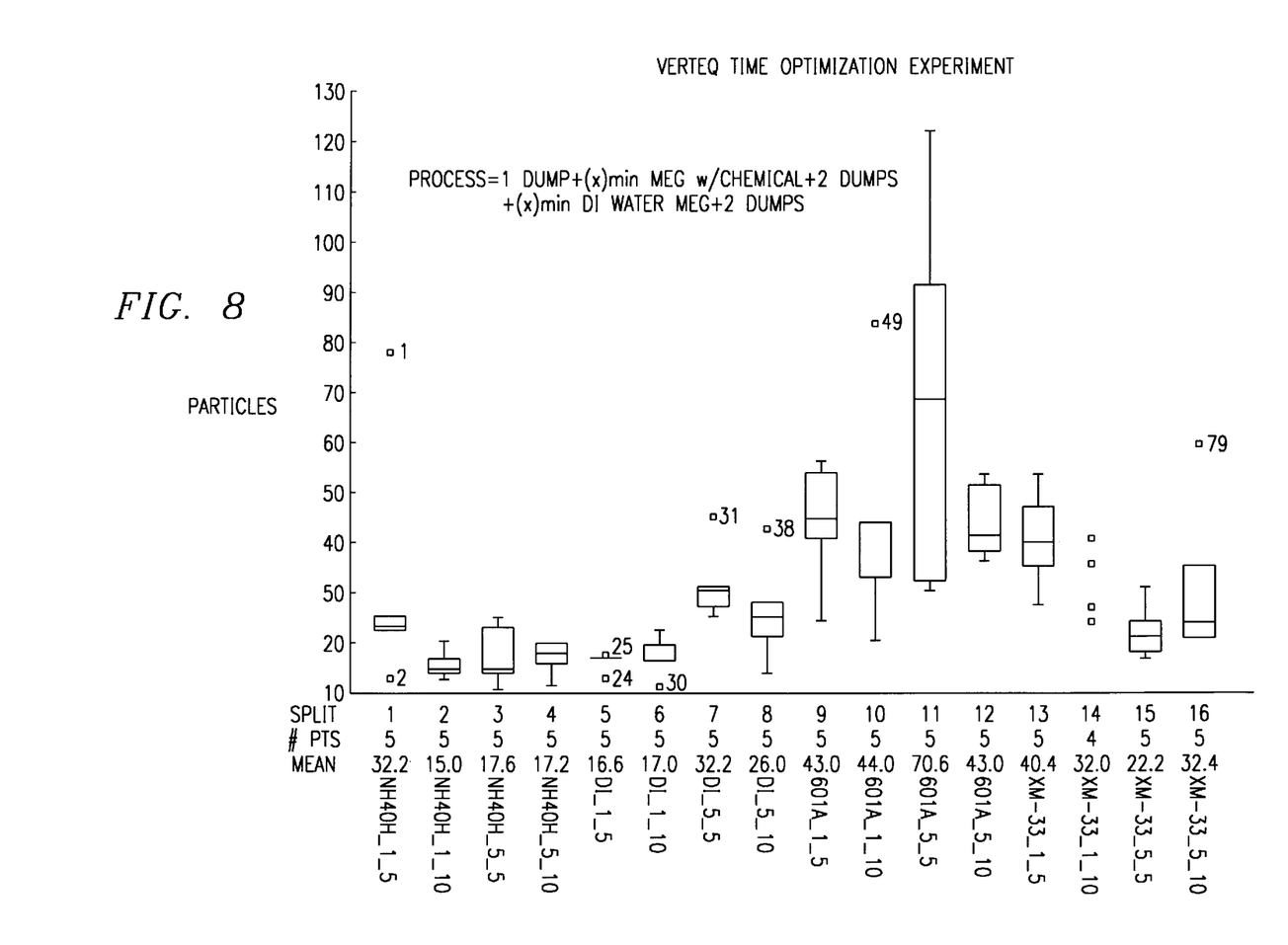
FIG. 8 is a graph of particle count versus cleaning time and chemical type.

FIG. 8 shows the particle count for various cleaning and rinse times for various chemicals. The chemical megasonic cleaning time was varied from 1 to 5 minutes and the DI water rinse megasonic time was varied from five to 10 minutes. The x-axis legend is set at chemical name_chemical megasonic clean time_DI water megasonic time. The $NH_4OH$ processes appear to have the lowest particle count of the chemicals tested.

After the megasonic bath (if one is desired), wafer 32 may be transferred to a scrubber 44 using a wet transfer such as DI water. Initially, wafer 32 may be stored in a DI water or similar solution while awaiting scrubbing. Some scrubbers contain what is called a jungle box 60 as shown in FIG. 3, for wafer storage where wafers are constantly sprayed with DI $H_2O$ or other chemicals as mentioned previously. Then, wafer 32 is transferred to a scrubbing station 46. Scrubbing station 46 contains a brush for scrubbing the wafer 32 surface. Both the wafer 32 and the brush are rotated while a controlled pH solution such as $NH_4OH$ and/or DI water is added. Other chemistries may be used in place of $NH_4OH$ preferably having a pH similar to that of the slurry. Preferably, both the front and back sides of each wafer are scrubbed using different scrubbing stations (46,48). If desired, a low concentration HF spray may be used after scrubbing to remove metal contaminants. Scrubbing further removes particles and ionic and metallic contaminants. After scrubbing, wafer 32 is transferred to a spin dry station 62 and spun dry. Wafer 32 is then ready for subsequent processing or testing. The actual chemistries used, scrubbing time, brush speed, and wafer rotational speed will vary by the type of scrubber used. Examples are discussed hereinbelow.

EXAMPLE I.

Figure 9:
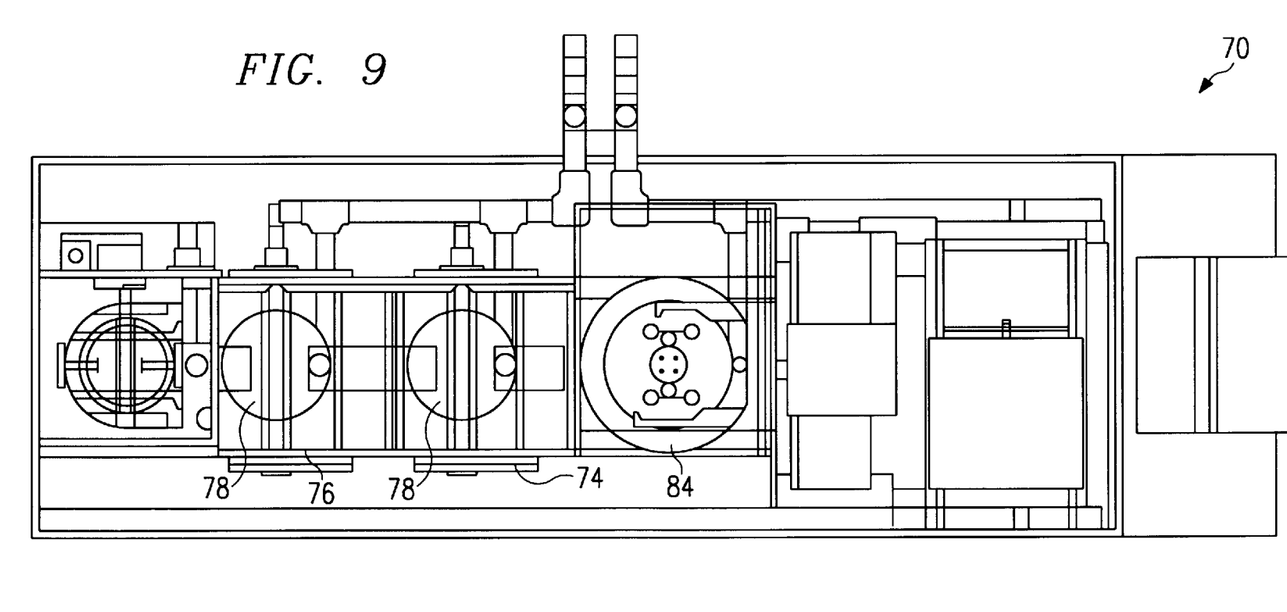
FIG. 9 is a schematic diagram of a scrubber which may be used to practice the invention.
Figure 10:
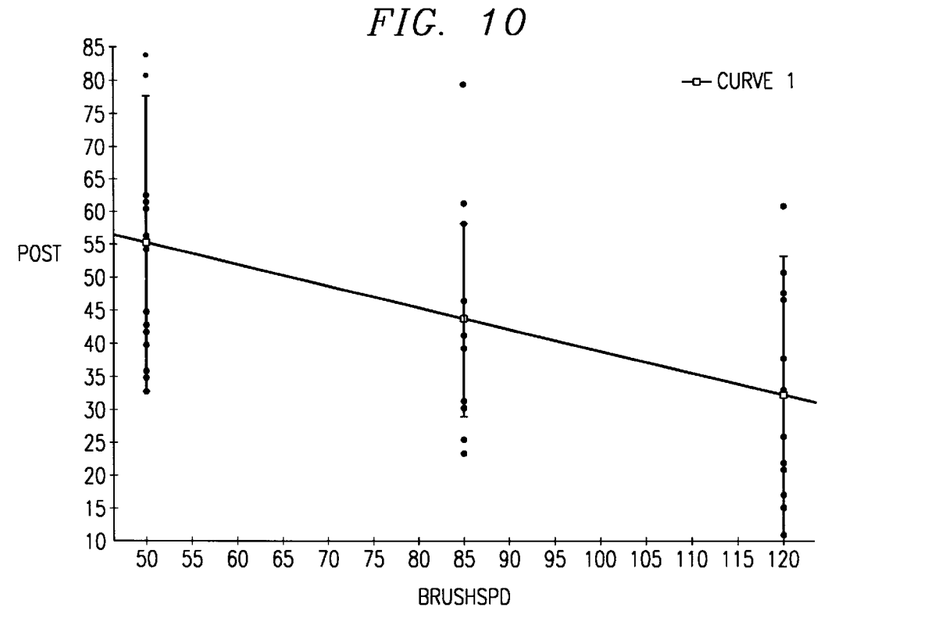
FIG. 10 is a graph of scrubber brush speed versus particle count.

FIG. 9 illustrates an example of one scrubber 70 that may be used in accordance with the invention. The wafer 32 is kept wet using DI water through a series of nozzles prior to the brush scrub operation. Of course, other solutions, such as $NH_4OH$, may alternatively be used. Two brush stations (74,76) are included for two step cleaning of tooth sides of wafer 32. Each brush station (74,76) is built with direct drive brushes 78 and two top and bottom sprays for the use of DI water during transport. A scrub solution spray is applied at each brush station to facilitate removal of particles from the wafer. A scrub solution spray having a pH similar to that of the slurry such as $NH_4OH$ may be used. Each brush core is hollow and plumbed with DI water for continuous rinsing of the brush. A brush speed on the order of 100 rpm is desired with a wafer rotation on the order of 60 rpms. As shown in FIG. 10, higher brush speeds result in lower particle counts. The outside brush gap is on the order 14.5 mm and the inside brush gap is on the order of 15.5 mm on the micrometer setting of the machine. A brush time on the order of 30 seconds is preferred. After scrubbing, the wafers are then spun dry 84.

EXAMPLE II.

Figure 11:
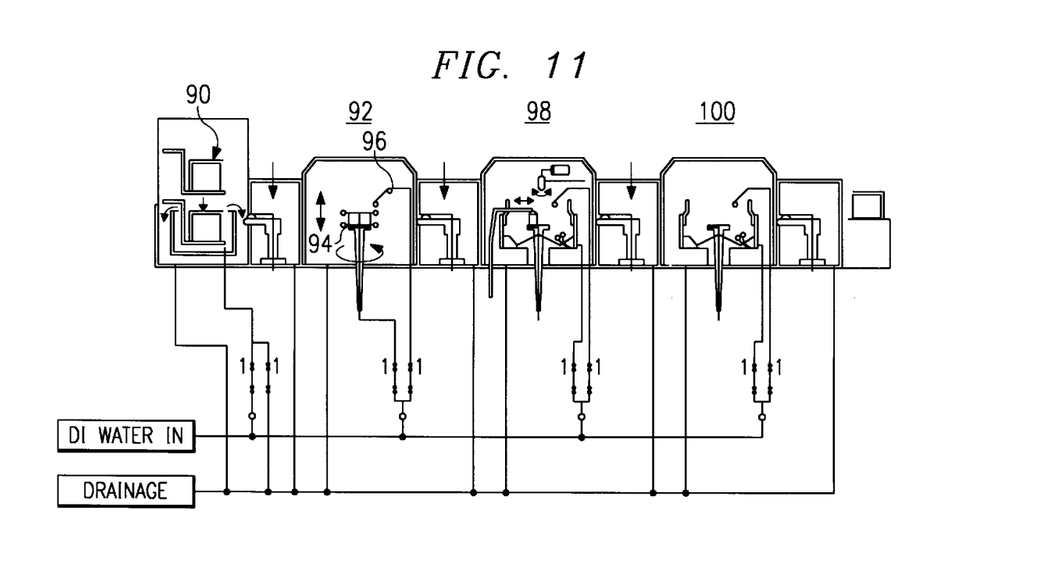
FIG. 11 is a schematic diagram of another scrubber which may be used to practice the invention.
Figure 12:
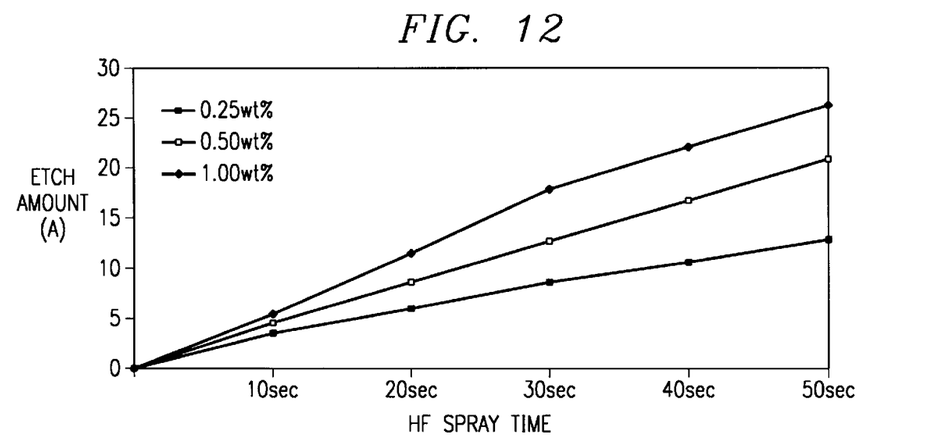
FIG. 12 is a graph of HF spray time in scrubber versus amount of thermal oxide removed.
Figure 13:
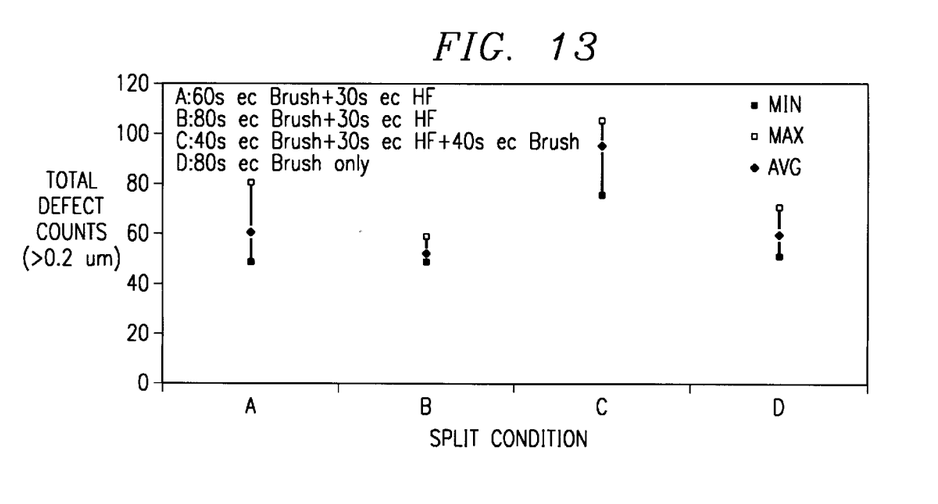
FIG. 13 is a graph of brush time and HF spray time in scrubber versus particle count.

FIG. 11 illustrates another scrubber that may be used in accordance with the invention. Wafers are loaded under DI water and kept submerged at the loader 90. The back of the wafer 32 is preferably scrubbed first since the particles remaining on the back side is not a critical as those remaining on the front side. Wafer 32 is transferred to a first scrubbing station 92. Scrubbing station 92 contains a brush 94 for scrubbing the back surface of wafer 32. Both the brush 94 and the wafer 32 are rotated while a scrubbing solution 96 is added. A brush speed on the order of 500–1000 rpm (e.g., 600 rpm) is used along with a wafer rotation on the order of 500–1000 rpm (e.g., 500 rpm), a scrubbing solution 96 of DI water and a duration on the order of 60–80 seconds (e.g., 80 seconds). The brush is preferably of the PVA type, but other alternatives such as mohair and nylon, may also be used as will be apparent to those skilled in the art. Nitrogen drying is preferably not used because it adversely affects particle count on the wafer surface and the D-sonic option of this machine is turned off. Then the front of the wafer is scrubbed under the same or similar conditions on a second scrub station 98. At this point a very low concentration (e.g., on the order of 0.25%–1%) HF may be sprayed on the wafer to remove a thin layer of contaminated top oxide. FIG. 12 shows the correlation between HF spray time and the amount of thermal oxide removed for three concentrations of HF (0.25 wt %, 0.5 wt %, and 1.0 wt %). The duration of HF spray is preferably on the order of 30 seconds. FIG. 13 shows the effect of brush time and HF spray time on particle performance. The HF spray after scrubbing removes most of the metal contaminants to below detection limits. The wafer 32 is then transferred to the spin dry chamber 100 where the wafer 32 is rinsed with DI water and then spun dried.

It should be noted that each of the above described steps contributes to the removal of unwanted particles from the wafer surface. The spindle rinsing, buffing, megasonic bath, and scrubber stations may thus each be used individually or in various combinations to accomplish the desired amount of particle/ionic and metallic contaminant removal. However, the preferred embodiment uses the following sequence: spindle rinsing, buffing, spindle rinsing, megasonic bath, scrubbing, and spin drying.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A post-CMP cleanup process for cleaning a chemically-mechanically polished wafer comprising the steps of:

transferring said wafer to a first scrubbing station;

scrubbing at least a first side of said wafer with a first brush; and applying a first solution to said wafer during said scrubbing said first side step, said first solution having a pH on the order of that of a slurry used for chemical-mechanical polishing.

2. The cleanup process of claim 1, further comprising the steps of:

transferring said wafer to a second scrubbing station;

scrubbing at least a second side of said wafer with a second brush; and applying a second solution to said wafer during said scrubbing said second side step, said second solution having a pH on the order of that of a slurry used for chemical-mechanical polishing.

3. The cleanup process of claim 2, wherein said first and second solutions comprise ammonium hydroxide.

4. The cleanup process of claim 1, wherein said first solution comprises ammonium hydroxide.

5. The cleanup process of claim 1, further comprising the step of applying a third solution to said first brush to clean said first brush during said scrubbing step.

6. The cleanup process of claim 5, wherein said third solution comprises de-ionized water.

7. The cleanup process of claim 1 wherein said transferring step occurs at least partially in de-ionized water.

8. The cleanup process of claim 1 wherein said transferring step occurs at least partially in a basic solution.

9. The cleanup process of claim 1 wherein said transferring step occurs at least partially in a solution selected from the group consisting of surfacants, anionic, cationic and non-ionic solutions.

10. The cleanup process of claim 1, further comprising the step of storing said wafer in de-ionized water prior to said scrubbing step.

11. The cleanup process of claim 1, wherein said scrubbing step comprises rotating both said first brush and said wafer.

12. The cleanup process of claim 1, wherein said first brush is selected from the group consisting of PVA, nylon, and mohair.

13. The cleanup process of claim 1 further comprising the step of spinning said wafer dry after said scrubbing step.

14. The cleanup method of claim 1 further comprising the step of spraying a solution containing a concentration of hydrogen-fluoride less than 0.2%.

15. The cleanup process of claim 14 wherein said spraying step lasts less than 1 minute.

16. The cleanup process of claim 1, further comprising the step of buffing the wafer prior to said transferring step.

17. The cleanup process of claim 1, further comprising the step of spinning said wafer while rinsing the wafer prior to said transferring step.

18. The cleanup process of claim 1, further comprising the step of using megasonic energy to clean said wafer prior to said transferring step.

19. A post-CMP cleanup process for removing particles from a wafer, comprising the steps of:

transferring a wafer to a rinsing station;

rotating said wafer at said rinsing station;

spraying a first solution on said wafer during said rotating step;

transferring said wafer to a buffing platen;

buffing said wafer;

transferring said wafer to said rinsing station;

rotating said wafer while spraying said first solution on said wafer;

transferring said wafer to a megasonic bath tank;

filling said megasonic bath tank with a second solution;

applying megasonic energy to said second solution and said tank;

transferring said wafer to a first scrubbing station;

rotating said wafer;

rotating a first brush against said wafer while applying a third solution; and spinning said wafer dry.

20. The process of claim 19, wherein all of said transferring step occur at least partially in a liquid.

21. The process of claim 19, wherein said liquid is de-ionized water.

22. The process of claim 19, wherein said first solution is de-ionized water and said wafer is rotated at a speed on the order of 120 rpm.

23. The process of claim 19, wherein said buffing said wafer step comprises the steps of:

rotating said wafer at a speed on the order of 120 rpm;

rotating a buffing platen at a speed on the order of 50 rpm;

placing said wafer in contact with said buffing platen with a down force on the order of 3 psi, wherein said buffing step has a duration on the order of 2 minutes.

24. The process of claim 19, wherein said second solution comprises ammonium hydroxide.

25. The process of claim 19, wherein said megasonic energy is on the order of 250 watts.

26. The process of claim 19, further comprising the steps of:

transferring said wafer to a second scrubbing station;

scrubbing at least a second side of said wafer with a second brush; and applying a fourth solution to said wafer during said scrubbing said second side step, said third and fourth solutions having a pH on the order of that of a slurry used for chemical-mechanical polishing.

27. The process of claim 26, wherein said third and fourth solutions comprise ammonium hydroxide.

28. The process of claim 19, further comprising the step of applying de-ionized water to said first brush to clean said first brush during said step of rotating a first brush against said wafer.

29. The cleanup method of claim 19, further comprising the step of spraying a solution containing a concentration of hydrogen-fluoride less than 0.2% after said rotating a first brush step.

* * * * *